(12) United States Patent
Saito et al.

(10) Patent No.: US 6,967,374 B1
(45) Date of Patent: Nov. 22, 2005

(54) POWER SEMICONDUCTOR DEVICE

(75) Inventors: Wataru Saito, Kanagawa (JP); Ichiro Omura, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 1 day.

(21) Appl. No.: 10/923,743

(22) Filed: Aug. 24, 2004

(30) Foreign Application Priority Data

Jul. 7, 2004 (JP) .............................. 2004-200584

(51) Int. Cl.[7] ........................ H01L 29/76; H01L 27/095
(52) U.S. Cl. ........................ 257/341; 257/401; 257/476
(58) Field of Search ............................. 257/327–329, 257/341, 342, 401, 471, 476

(56) References Cited

U.S. PATENT DOCUMENTS

| 5,753,938 | A | * | 5/1998 | Thapar et al. | ................. | 257/77 |
| 6,081,009 | A | | 6/2000 | Neilson | ....................... | 257/341 |
| 6,465,844 | B2 | | 10/2002 | Saito et al. | .................. | 257/336 |
| 6,586,801 | B2 | * | 7/2003 | Onishi et al. | ................. | 257/339 |
| 6,825,105 | B2 | * | 11/2004 | Grover et al. | .............. | 438/570 |
| 6,849,880 | B1 | * | 2/2005 | Saito et al. | .................. | 257/135 |
| 6,903,418 | B2 | * | 6/2005 | Iwamoto et al. | ............ | 257/342 |

FOREIGN PATENT DOCUMENTS

| JP | 2002-156978 | 6/2000 |
| JP | 2002-525853 | 8/2002 |

* cited by examiner

*Primary Examiner*—T. N. Quach
(74) *Attorney, Agent, or Firm*—Oblon, Spivak, McClelland, Maier Neustadt, P.C.

(57) ABSTRACT

There are provided a power switching element including a first semiconductor layer of a first conductivity type; a plurality of second semiconductor layers of a second conductivity type, which are in a columnar shape, and arranged in the first semiconductor layer at certain intervals in a direction parallel to a layer surface of the first semiconductor layer; a first electrode formed on a surface of one side of the first semiconductor layer, the first electrode being electrically connected with the first semiconductor layer; a plurality of third semiconductor layers selectively formed in a surface region of the other side of the first semiconductor layer, the third semiconductor layers being connected to the second semiconductor layers; a fourth semiconductor layer of the first conductivity type selectively formed in a surface region of the third semiconductor layers; second electrodes formed so as to contact surfaces of the third semiconductor layers and the fourth semiconductor layer; and gate electrodes formed on regions of the first semiconductor layer sandwiched between the adjacent third semiconductor layers, gate dielectric films being inserted between the gate electrodes and the first semiconductor layer, and a Schottky barrier diode in which a cathode is connected to the first electrode of the power switching element, and an anode is connected to the second electrodes of the power switching element.

20 Claims, 20 Drawing Sheets

POWER SEMICONDUCTOR DEVICE

CROSS-REFERENCE TO RELATED APPLICATION

This application is based upon and claims the benefit of priority from prior Japanese Patent Application No. 2004-200584, filed on Jul. 7, 2004, the entire contents of which are incorporated herein by reference.

BACKGROUND OF THE INVENTION

1. Field of the Invention

The present invention relates to power semiconductor devices.

2. Related Art

There is a demand for a more efficient and smaller power supply circuit such as a switching power supply, an inverter, etc. One way for achieving this would be a decrease in power loss in a power switching element in a power supply circuit, specifically a decrease in conduction loss achieved by a decrease in ON voltage of a power switching element, or a decrease in switching loss achieved by a decrease in switching charge. With such a decrease in power loss, it is possible to increase the circuit efficiency. In addition, it is possible to decrease the size of a power supply by decreasing the size of passive elements in a circuit by increasing the frequency of the switching frequency. Conventionally, hard switching, in which a high voltage and a high current are applied to a switching element, has been performed. However, in such cases, a problem of noise at the time of performing a switching operation arises, which is caused by increasing the switching frequency.

In order to solve this problem, a soft switching circuit technique has been developed as a means for achieving a higher efficiency and a smaller size without increasing noise, as disclosed in Japanese Patent Laid-Open Publication No. 2000-156978. In soft switching, the switching loss can be made negligibly small, and the noise at the time of switching can also be reduced by performing a switching operation under a condition where almost no voltage is applied.

In a conventional power supply circuit, a vertical power MOSFET has been widely used as a switching device. Even if the switching system is changed to a soft switching system, a vertical power MOSFET is one of the most widely used switching elements. However, a conventionally used power MOSFET cannot offer satisfactorily outstanding performance because of the switching system being different, since the performance expected for an element is different in the soft switching.

SUMMARY OF THE INVENTION

A power semiconductor device according to an aspect of the present invention includes: a power switching element having: a first semiconductor layer of a first conductivity type; a plurality of second semiconductor layers of a second conductivity type, which are in a columnar shape, and arranged in the first semiconductor layer at certain intervals in a direction parallel to a layer surface of the first semiconductor layer; a first electrode formed on a surface of one side of the first semiconductor layer, the first electrode being electrically connected with the first semiconductor layer; a plurality of third semiconductor layers selectively formed in a surface region of the other side of the first semiconductor layer, the third semiconductor layers being connected to the second semiconductor layers; a fourth semiconductor layer of the first conductivity type selectively formed in a surface region of the third semiconductor layers; second electrodes formed so as to contact surfaces of the third semiconductor layers and the fourth semiconductor layer; and gate electrodes formed on regions of the first semiconductor layer sandwiched between the adjacent third semiconductor layers, gate dielectric films being inserted between the gate electrodes and the first semiconductor layer, and a Schottky barrier diode in which a cathode is connected to the first electrode of the power switching element, and an anode is connected to the second electrodes of the power switching element.

DESCRIPTION OF THE EMBODIMENTS

Figure 1:
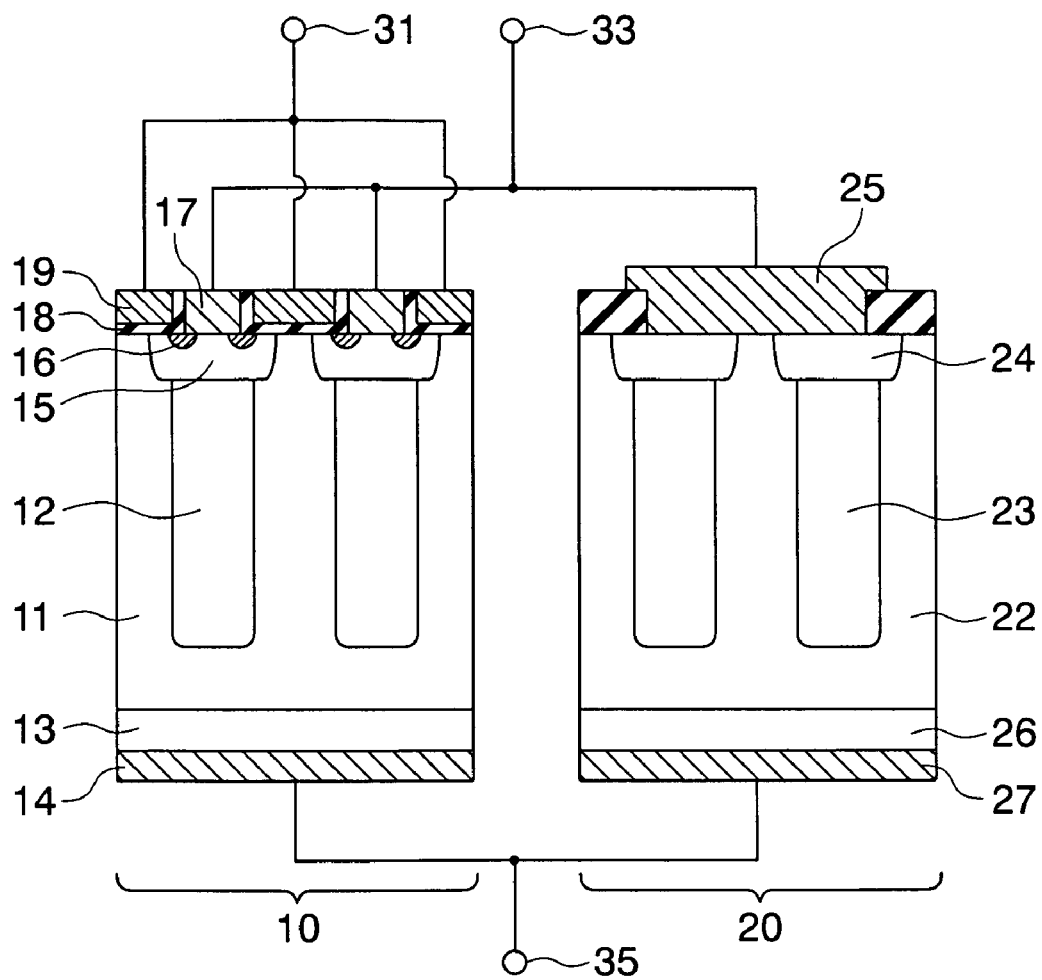
FIG. 1 is a sectional view showing the structure of a power semiconductor device according to a first embodiment of the present invention.

Before the embodiments of the present invention are described, the course of events before the present inventors achieved the present invention will be described below.

The present inventors considered that it would be possible to have a highly efficient, small, and low-noise power supply by creating a power MOSFET satisfying the performance required for a power supply circuit using a soft switching system. The three performance items required for a soft switching circuit are:

(1). Low ON voltage
(2). Low input gate capacitance
(3). High-speed reverse recovery of parallel diode.

In a soft switching system in which the switching loss is negligibly small, the most important factor for a high efficiency is a decrease in ON voltage since most of the power loss is caused by conduction loss. In addition, a lower gate input capacitance is preferable in order to perform switching operation in a very short time during which almost no voltage is applied, and to decrease the loss in a gate driver. Finally, in soft switching, a switching element is changed from an OFF state to an ON state with a parallel diode being in an ON state. Accordingly, a turn-on operation of the switching element is accompanied by a recovery operation of diode, i.e., an operation for changing a diode from an ON state to an OFF state. Therefore, the turn-on loss corresponds to the sum of the turn-on loss of the switching element itself and the recovery loss of the diode. As a result, a high-speed parallel diode with a low loss is required. In particular, since a power MOSFET includes an internal diode composed of a p-type base region and an n-type drift region, the characteristics of the internal diode determine the turn-on loss.

The present inventors therefore considered that it would be possible to create a power semiconductor device including a power MOSFET suitable for a soft switching system by combining a power MOSFET with a diode having a low recovery loss.

Hereinafter, embodiments of the present invention will be described with reference to the accompanying drawings. In the drawings, the same reference numerals are assigned to the same elements.

First Embodiment

FIG. 1 is a sectional view showing the structure of a power semiconductor device according to a first embodiment of the present invention. The power semiconductor device according to this embodiment includes a power MOSFET 10 and a Schottky barrier diode (hereinafter also referred to as "SBD") 20.

The power MOSFET 10 has a superjunctoin structure composed of an $n^-$ type drift layer 11 and a plurality of $p^-$ type pillar layers 12 formed within the $n^-$ type drift layer 11. An n+ type drain layer 13 having a higher concentration than the $n^-$ type drift layer 11 is formed on a surface of one side (in the drawing, the lower side) of the $n^-$ type drift layer 11, and a drain electrode 14 is formed on a surface of a side of the n+ type drain layer 13 opposite to the side of the $n^-$ type drift layer 11. The drain electrode 14 is connected to a drain terminal 35. The $n^+$ type drain layer 13 can be formed on one side of the $n^-$ type drift layer 11 by an impurity diffusion, or crystal growth of the $n^-$ type drift layer 11 can be performed using the $n^+$ type drain layer 13 as a substrate.

In a surface region of the other side of the $n^-$ type drift layer 11 (the side opposite to the $n^+$ type drain layer 13) are formed p type base layers 15 each corresponding to and being connected with one of the $p^-$ type pillar layers 12. The p type base layers 15 are arranged in a stripe pattern, and extend in a direction perpendicular to the surface of the drawing paper. Two of the strip-shaped n type source layers 16 are formed in the surface region of each p type base layer 15 so as to and extend in a direction perpendicular to the drawing paper. Each of the p type base layers 15 serves as a channel.

Gate dielectric films 18 of a silicon oxide, having a thickness of about 0.1 $\mu$m, are formed in a stripe pattern and extend in a direction perpendicular to the direction of the drawing paper, each gate dielectric film 18 contacting the n type drift layers 11 located between two adjacent p type base layer 15, the two adjacent p type base layers 15 themselves, and the n type source layers 16 formed on the base layer 15. Gate electrodes 19 are formed in a stripe pattern on the gate dielectric films 18 in a direction perpendicular to the direction of the drawing paper. The gate electrodes 19 are connected to a common gate terminal 31.

Furthermore, a strip-shaped source electrode 17 is formed and extends in a direction perpendicular to the drawing paper in a region between adjacent gate electrodes 19, the source electrode 17 contacting the n type source layers 16 formed on the common p type base layer 15, and the p type base layer 15 itself. The source electrodes 17 are connected to a common source terminal 33. The gate electrode 19 and the source electrode 17 are electrically insulated by the gate dielectric film 18.

The SBD 20 is connected in parallel between the source electrodes and the drain electrode of the power MOSFET 10, the SBD 20 having a superjunctoin structure. In the SBD 20, an $n^-$ type drift layer 22 and a plurality of $p^-$ type pillar layers 23 formed in the $n^-$ type drift layer 22 constitute the superjunctoin structure. Guard ring layers 24 each corresponding to and being connected to one of the $p^-$ type pillar layers 23 are formed in a stripe pattern and extend in a direction perpendicular to the drawing paper.

An anode electrode 25 is provided so as to contact adjacent guard ring layers 24 and the $n^-$ type drift layer 22 between the adjacent guard ring layers 24. The anode electrode 25 is connected to the source terminal 33 of the power MOSFET 10. The anode electrode 25 and the $n^-$ type drift layer 22 constitute a Schottky junction.

An n+cathode layer 26 is formed on a surface of the other side (the side opposite to the side where the guard ring layers 24 are formed) of the $n^-$ type drift layer 22, the $n^+$ cathode layer 26 being electrically connected to a cathode electrode 27. The cathode electrode 27 is connected to the drain terminal 35 of the power MOSFET 10.

Generally, in a soft switching circuit, when a MOSFET is just turned on, a current is flowing through a diode. Accordingly, a recovery operation at the time of the turning-on of the diode causes a power loss. Since the diode in a MOSFET is a pn diode, which is a bipolar element, the recovery operation thereof takes a considerable amount of time.

This embodiment has a structure in which the SBD 20 is connected in parallel with the power MOSFET 10. An SBD, which is a unipolar element, allows for a higher-speed recovery as compared with a pn diode, which is a bipolar element. Accordingly, in this embodiment, it is possible to prevent an increase in turn-on loss caused by the recovery of a diode (in this embodiment, a diode constituted by the p type base layer 15 and the n⁻ type drift layer 11) in the power MOSFET 10. Generally, the threshold voltage of an SBD is as low as about 0.3 V while the threshold voltage of a pn diode is about 0.7 V. Accordingly, in this embodiment, a current flows through the SBD 20 instead of the internal pn diode constituted by the p type base layer 15 and the n⁻ type drift layer 11.

It is possible to make the current flow only through the SBD 20 by increasing the ON voltage of the internal diode of the power MOSFET 10. The increase in the ON voltage of the internal diode of the power MOSFET 10 can be achieved by shortening the carrier lifetime (time required for re-coupling) of the n⁻ type drift layer 11 of the power MOSFET 10. It is possible to shorten the carrier lifetime to 1 μs or less by performing the doping of platinum or gold into the n⁻ type drift layer 11 or the irradiation of an electron beam or proton to the n⁻ type drift layer 11. Due to this, it is possible to increase the ON voltage of the internal diode by 0.2 V or more. Even if a large voltage were applied to turn on the internal diode, the increase in recovery loss would be small since the speed of the internal diode has been increased by shortening the carrier lifetime.

It is preferable that a metal having a high Schottky barrier such as platinum be used to form the anode electrode 25 so as to curb the inverse direction leakage current of the SBD 20. In this way, the inverse direction leakage current is decreased, and it becomes possible to operate the device at a high temperature. When the Schottky barrier becomes higher, the threshold voltage of the SBD 20 also becomes higher, thereby decreasing the degree of difference in the ON voltage between the SBD 20 and the internal diode. In such a case, when the carrier lifetime of the power MOSFET is shortened, the ON voltage of the internal diode becomes higher, thereby increasing the degree of difference. As a result, it is possible to increase the height of the Schottky barrier of the SBD 20.

Furthermore, in the SBD 20 of this embodiment, there is a parasitic pn diode constituted by the guard ring layer 24 and the n⁻ type drift layer 22. In order to prevent this parasitic pn diode from operating, the carrier lifetime in the SBD 20 should be shortened. Since the SBD 20 is a unipolar element, the ON voltage thereof is not dependent on the carrier lifetime. Therefore, when the carrier lifetime is shortened, the ON voltage is not increased. Thus, it is possible to prevent the parasitic pn diode from operating.

As described above, according to this embodiment, it is possible to have a power semiconductor device including a power MOSFET suitable for soft switching.

(Modification)

Figure 2:
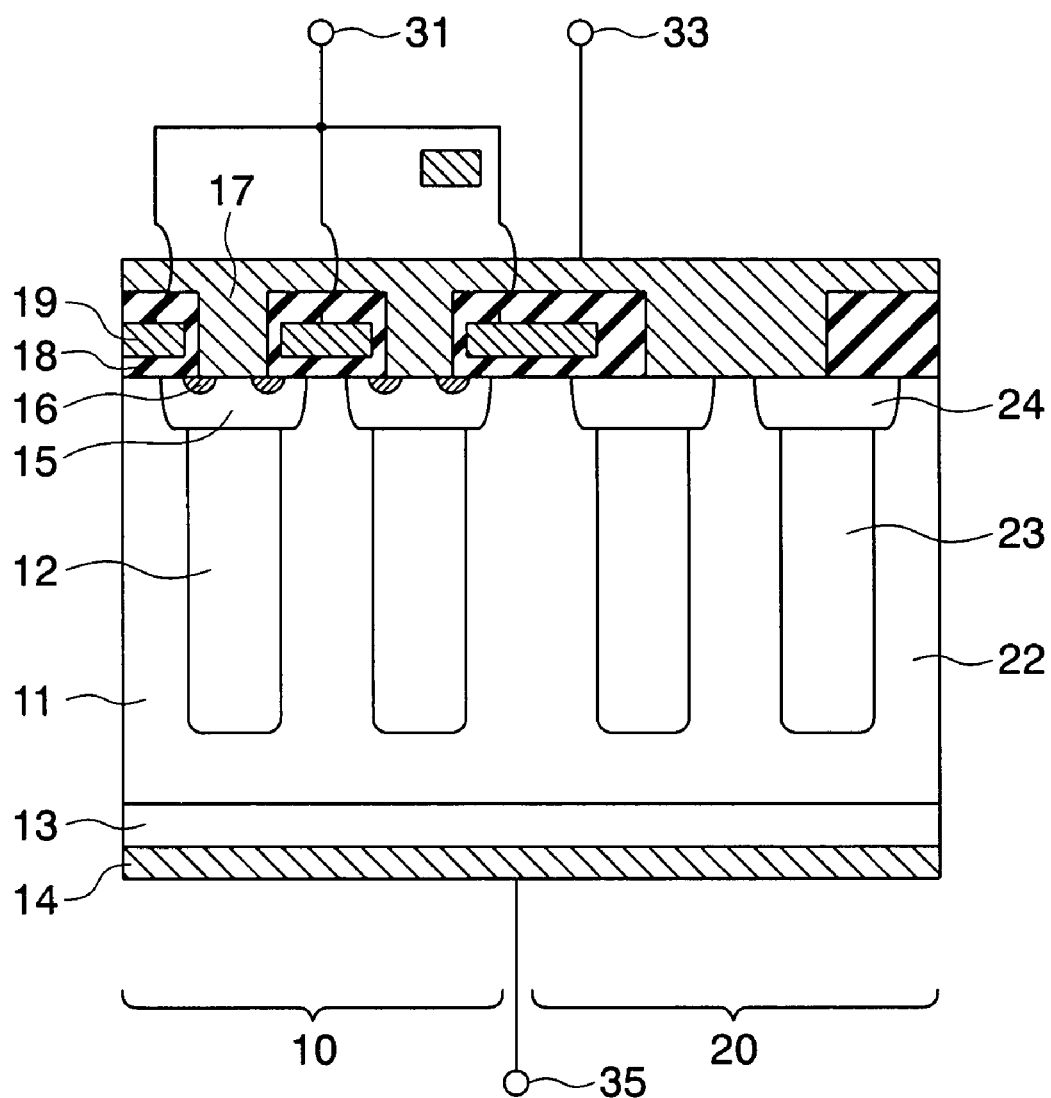
FIG. 2 is a sectional view showing the structure of a power semiconductor device according to a modification of the first embodiment of the present invention.

FIG. 2 shows the structure of a modification of the power semiconductor device according to the first embodiment, in which the power MOSFET 10 and the SBD 20 are formed on the same substrate. Since both of the power MOSFET 10 and the SBD 20 have the same superjunctoin structure, it is possible to form these elements by the same process.

It is possible to make a current flow only through the SBD 20 by making the chip area of the SBD 20 greater than that of the MOSFET 10, thereby decreasing the current density within the SBD 20 to increase the difference in ON voltage between the internal diode of the MOSFET 10 and the SBD.

Like the first embodiment, this modification can provide a power semiconductor device including a power MOSFET suitable for a soft switching system.

Second Embodiment

Figure 3:
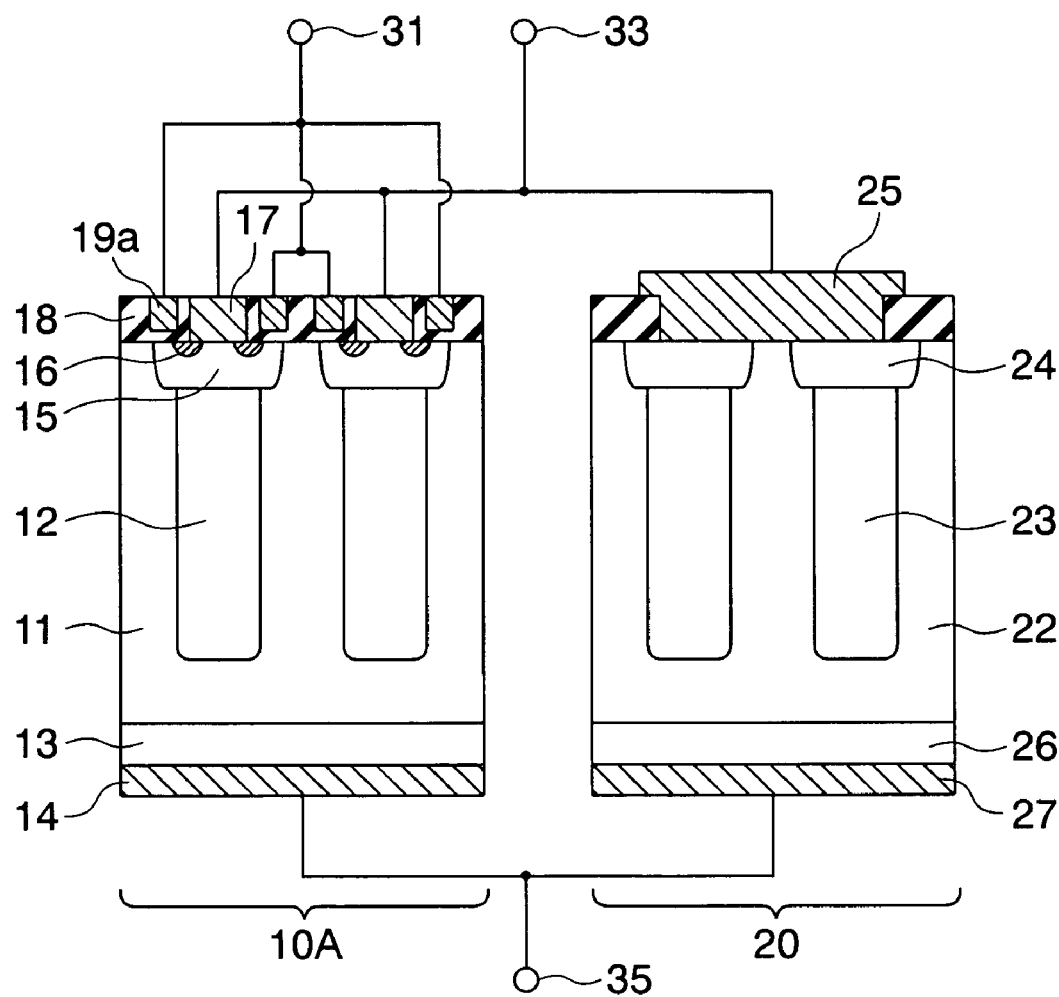
FIG. 3 is a sectional view showing the structure of a power semiconductor device according to a second embodiment of the present invention.

Next, a power semiconductor device according to a second embodiment of the present invention will be described below with reference to FIG. 3, which is a sectional view showing the structure thereof. The power semiconductor device of this embodiment includes a power MOSFET 10A and a SBD 20.

Like the power MOSFET 10 of the first embodiment shown in FIG. 1, the power MOSFET 10A has a superjunctoin structure obtained by replacing the gate electrode 19 of the first embodiment with a gate electrode 19a having a split gate structure in which the gate is split into two. With the gate electrode 19a having such a split gate structure, it is possible to decrease the gate—drain capacitance. In soft switching, the gate—source capacitance and the gate—drain capacitance at the time when the drain voltage is low should be curbed since a switching operation is performed before the drain voltage increases. As a result, it is preferable that the gate length be as short as possible. With the split gate structure, it is possible to decrease the gate capacitance, thereby performing a switching operation at a higher speed than the first embodiment.

The second embodiment can also provide a power semiconductor device including a power MOSFET suitable for a soft switching system.

(Modification)

Figure 4:
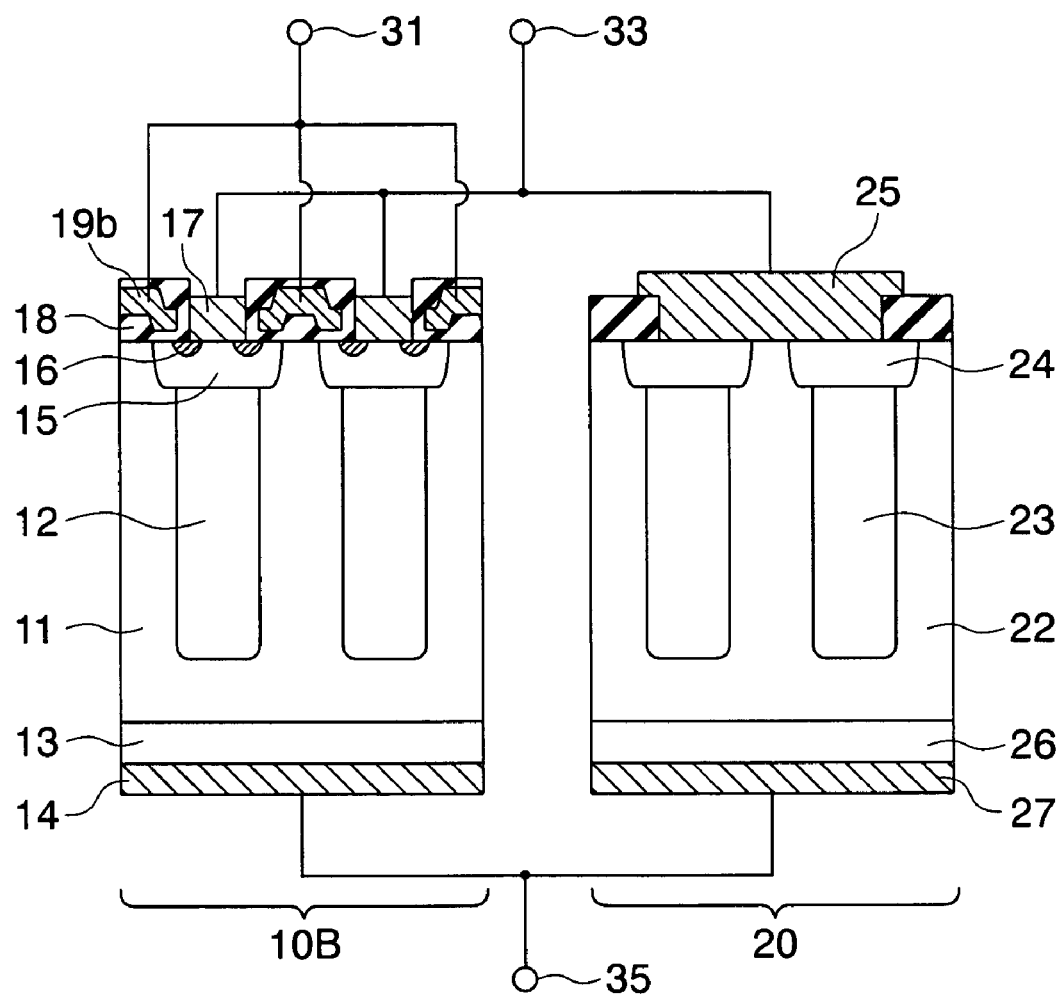
FIG. 4 is a sectional view showing the structure of a power semiconductor device according to a modification of the second embodiment of the present invention.

FIG. 4 shows the structure of a modification of the power semiconductor device according to the second embodiment. The power semiconductor device of this modification can be obtained by replacing the power MOSFET 10A of the second embodiment with a power MOSFET 10B, in which the gate electrode 19a of the power MOSFET 10A is replaced with a gate electrode 19b having a terrace gate structure. With this structure, it is possible to decrease the gate—drain capacitance as in the case of the split gate structure of the second embodiment, thereby achieving a high-speed operation. The gate electrode may have a structure obtained by combining the split gate structure and the terrace gate structure.

Third Embodiment

Figure 5:
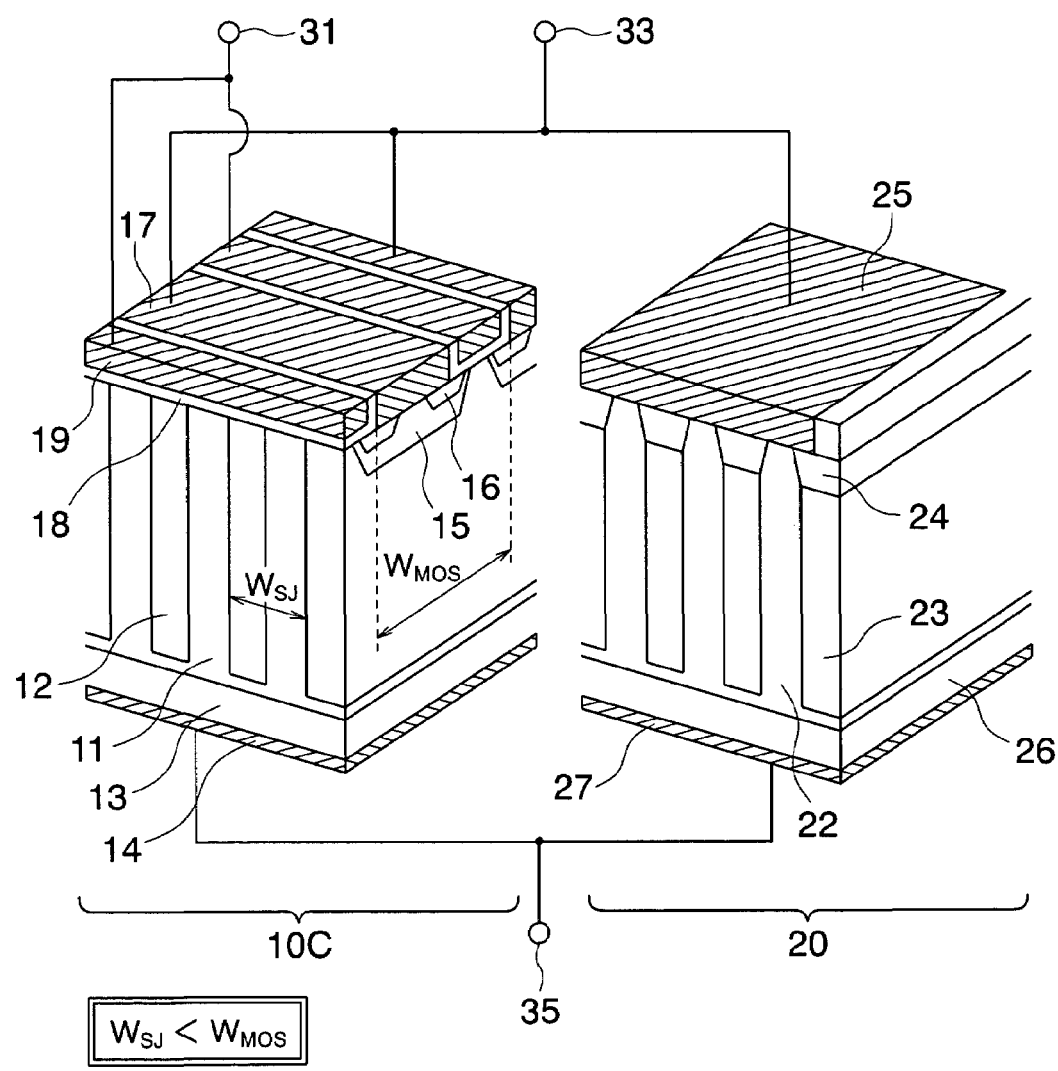
FIG. 5 is a perspective view showing the structure of a power semiconductor device according to a third embodiment of the present invention.

Next, a power semiconductor device according to a third embodiment of the present invention will be described with reference to FIG. 5, which is a perspective view schematically showing the structure of the power semiconductor device of this embodiment obtained by replacing the power MOSFET 10 of the first embodiment with a power MOSFET 10C.

In the power MOSFET 10 of the power semiconductor device according to the first embodiment shown in FIG. 1, the p⁻ type pillar layers 12 are formed in a stripe pattern and extend in a direction perpendicular to the direction of the drawing paper, and the p type base layers 15 are also formed in a direction perpendicular to the drawing paper. Accordingly, the p⁻ type pillar layers 12 and the gate electrodes 19 are formed in a stripe pattern in the same direction. In contrast with this, in the power MOSFET 10C of this embodiment, the p⁻ type pillar layers 12 and the gate electrodes 19 are formed in a stripe pattern so as to intersect with each other. Accordingly, the p type base layers 15, the n type source layers 16 formed within each pf the p type base layers 15, and the source electrodes 17 are also formed in a stripe pattern in a direction perpendicular to the direction of the p⁻ type pillar layers 12 formed in a stripe pattern. The power MOSFET 10C of this embodiment has the same structure as the power MOSFET 10 of the first embodiment, except that the p type base layers 15, the n type source layers 16 formed within each of the p type base layers 15, the source electrodes 17, and the gate electrodes 19 are formed in a stripe pattern in a direction perpendicular to the direction in which the p⁻ type pillar layers 12 are formed in a stripe pattern. Of course, in this embodiment, the n⁻ type drift layer 11 and the p⁻ type pillar layers 12 have a superjunctoin structure as shown in FIG. 5.

The ON resistance of a power MOSFET is proportional to the horizontal direction interval $W_{SJ}$ of the superjunctoin structure. Accordingly, in order to curb the ON resistance, the horizontal direction interval $W_{SJ}$ should be narrowed. On the other hand, the gate capacitance of a power MOSFET is proportional to the gate area of the MOSFET. Accordingly, in order to curb the gate capacitance, the horizontal interval $W_{MOS}$ of the gate structure should be widened so that the gate area relative to the entire area is decreased. By forming the stripe-pattern superjunctoin structure and the stripe-pattern MOS gate structure so as to intersect with each other, as in the case of this embodiment, it is possible to make $W_{SJ}$ different from $W_{MOS}$. With the horizontal direction interval $W_{MOS}$ being wider than the horizontal direction interval $W_{SJ}$, it is possible to perform a high speed switching operation with the ON resistance being curbed. As shown in FIG. 5, in this embodiment, a soft switching element with a low loss can be achieved by connecting the SBD 20 having the superjunctoin structure in parallel with the power MOSFET 10C.

(First Modification)

Figure 6:
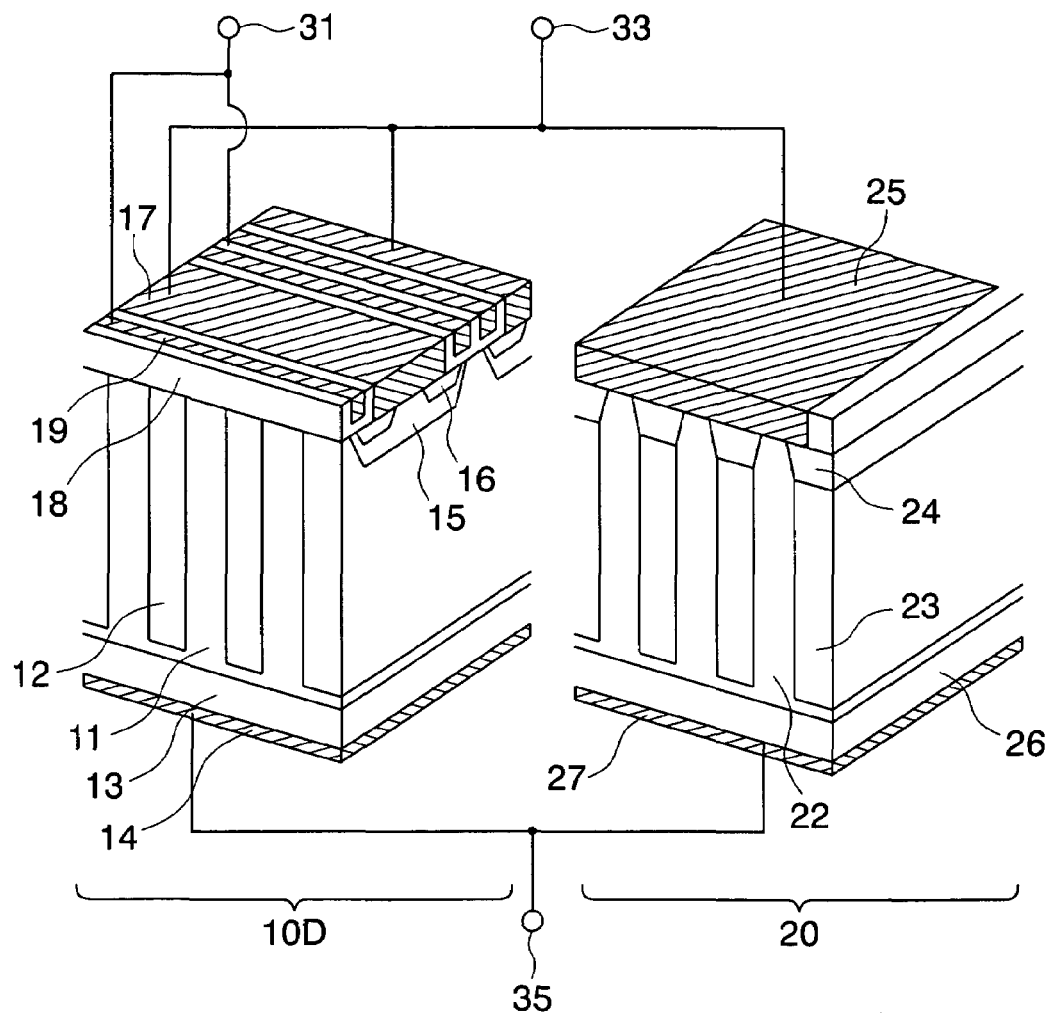
FIG. 6 is a perspective view showing the structure of a power semiconductor device according to a first modification of the third embodiment of the present invention.

The structure of a power semiconductor device according to a first modification of the third embodiment is shown in FIG. 6. The power semiconductor device according to the first modification is obtained by replacing the power MOSFET 10C of the third embodiment shown in FIG. 5 with a power MOSFET 10D, which can be obtained by modifying the gate electrode 19 of the power MOSFET 10C so as to have the split gate structure. With this structure, it is possible to lower the gate capacitance further, thereby achieving a higher-speed operation. As a result, the load of the gate drive circuit can be decreased. Although FIG. 6 shows the split gate structure, the same effect can be obtained by using the terrace gate structure.

(Second Modification)

Figure 7:
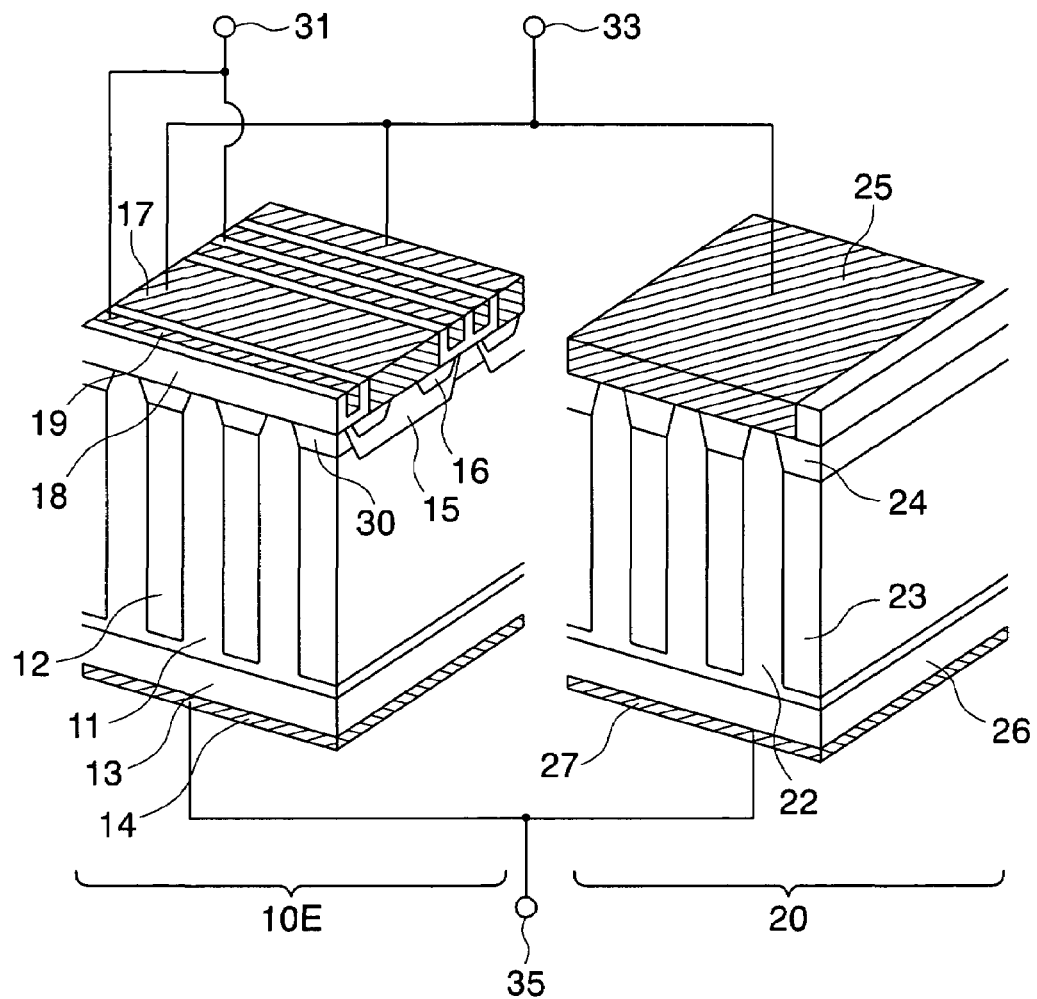
FIG. 7 is a perspective view showing the structure of a power semiconductor device according to a second modification of the third embodiment of the present invention.

FIG. 7 shows the structure of a power semiconductor device according to a second modification of the third embodiment, which is obtained by replacing the pose MOSFET 10D of the first modification shown in FIG. 6 with a power MOSFET 10E, in which p type gate layers 30 are formed only on the surfaces of the p⁻ type pillar layers 12 at the portions under the split gate.

When the intervals of the MOS gates are widened, the MOS gates are made to have the split gate structure, and the intervals of the p type base layers 15 are also widened, not only is the MOS gate capacitance decreased, but also the resistance of a JFET region between adjacent two of the p type base layers 15 is decreased, thereby enabling a decrease in ON resistance. However, when the intervals of the p-type base layers 15 become too wide, the electric field concentrates at the end portions of the p type base layers 15, thereby decreasing the withstand voltage. By adding the p type gates layers 30 on the surface of the p⁻ type pillar layers 12, is it possible to relax the electric field, thereby curbing the decrease in withstand voltage. Since the p⁻ type gate layers 30 are formed only on the surfaces of the p⁻ type pillar layers 12, the ON resistance is not increased.

A high-speed switching operation with a low ON resistance can also be achieved by forming the superjunctoin structure in a lattice form, and the MOS gate structure in a stripe pattern, and by making the horizontal direction intervals of the superjunctoin structure narrow, and the horizontal direction intervals of the MOS gate structure wider than those of the superjunctoin structure.

Fourth Embodiment

Figure 8:
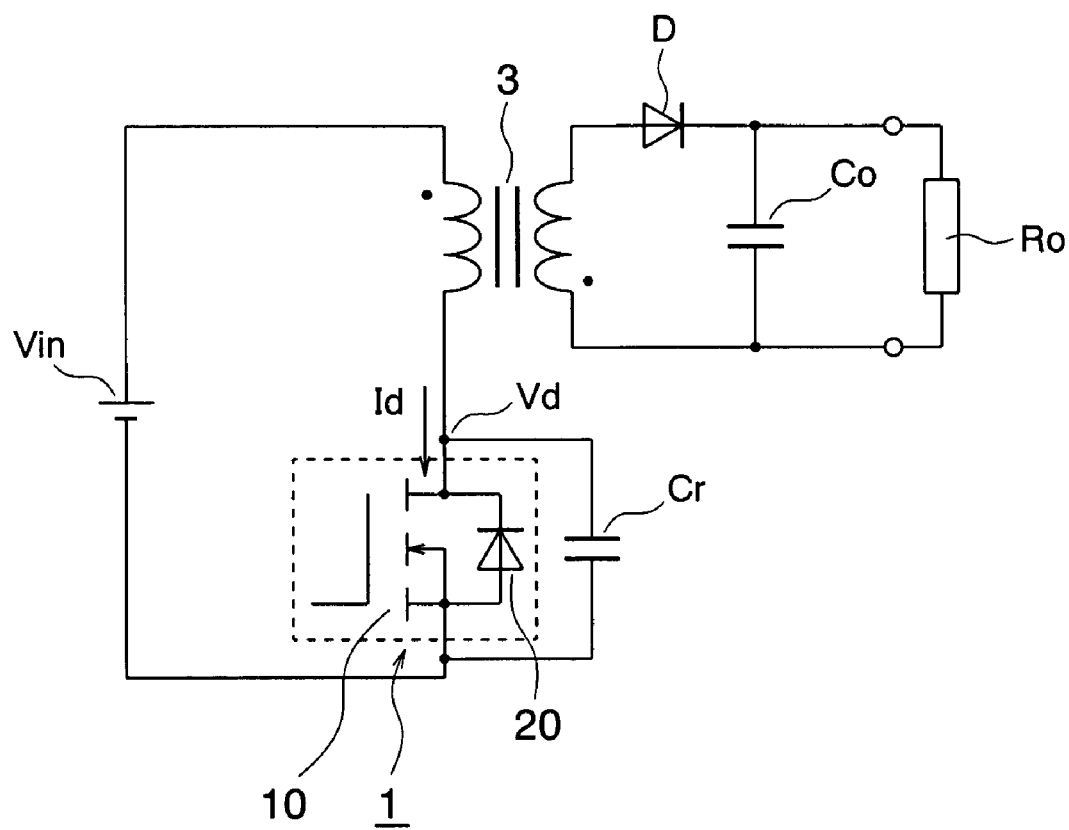
FIG. 8 is a circuit diagram showing the structure of a soft switching flyback converter according to a fourth embodiment of the present invention.

The structure of a flyback converter according to a fourth embodiment of the present invention is shown in FIG. 8, which is a schematic circuit diagram. The flyback converter according to this embodiment includes a power supply Vin, a power semiconductor device 1, a capacitor Cr connected in parallel with the power semiconductor device 1, a transformer 3, a diode D, and a capacitor Co and a resistance Ro which are connected in parallel with each other. The power semiconductor device 1 is any of those of the first to third embodiment, which includes a power MOSFET 10 and a SBD 20.

Figure 9:
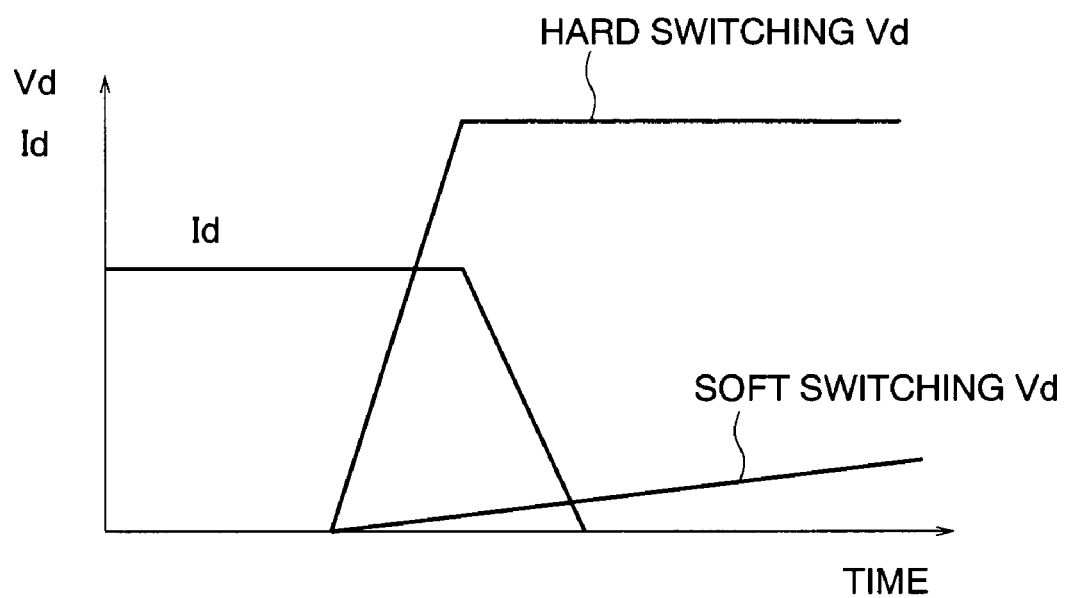
FIG. 9 shows switching waveform of the fourth embodiment.

In this embodiment, a soft switching operation for interrupting a current Id before a drain voltage Vd boosts by curbing the change in voltage dV/dt at the time of the turning-off, as shown in FIG. 9, can be achieved by connecting the capacitance Co in parallel with the MOSFET. Since the turn-off loss is determined by the product of the drain current Id and the drain voltage Vd, the soft switching in which the drain voltage Vd is low produces a small turn-off loss. Furthermore, since electromagnetic wave noise is produced by a great change in voltage or current at the time of switching, soft switching produces lower noise.

Figure 10:
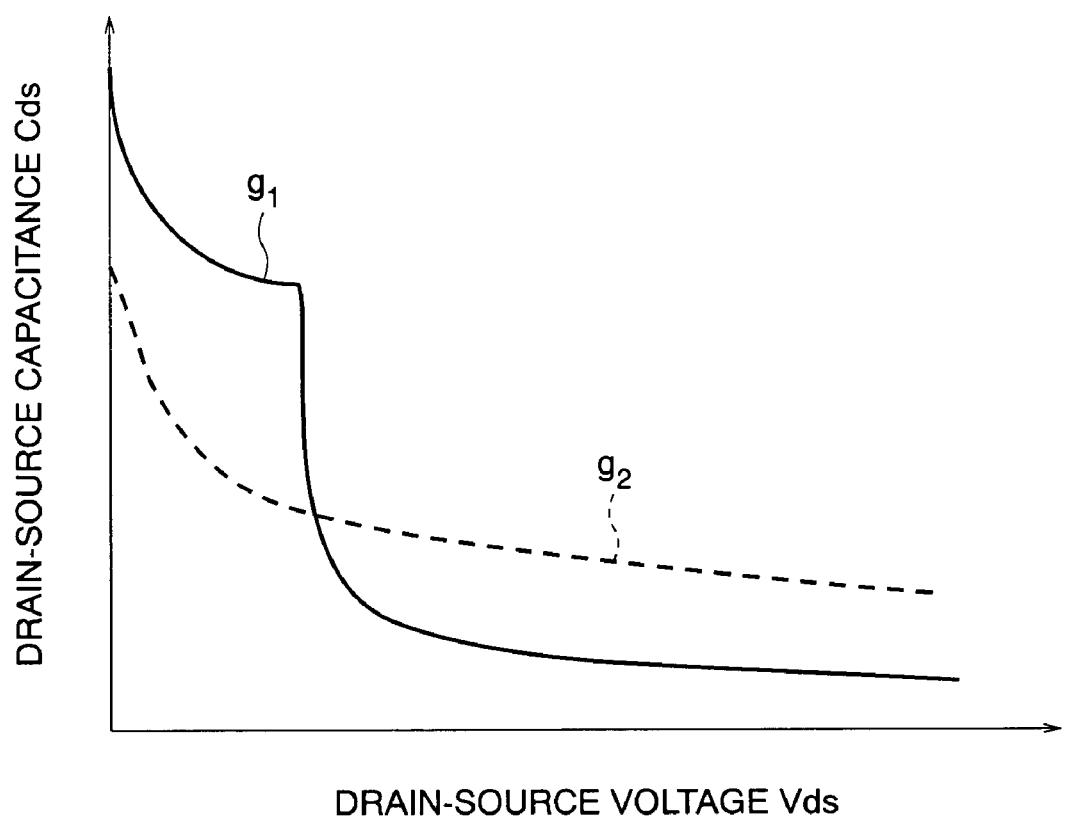
FIG. 10 is a graph showing characteristics of the source—drain capacitance and the source—drain voltage of the power MOSFET according to the fourth embodiment.

It is possible to decrease the change in voltage dV/dt by increasing the capacitance Co which is connected in parallel with the MOSFET. FIG. 10 shows the characteristics of the capacitance and voltage between source and drain of a power MOSFET having the superjunctoin structure as shown in FIGS. 1–7 and a power MOSFET not having the superjunctoin structure. The line g1 of FIG. 10 represents the capacitance—voltage characteristic between the source and drain of the power MOSFET having the superjunctoin structure as shown in FIGS. 1–7, and the line g2 represents the capacitance—voltage characteristic between the source and drain of the power MOSFET not having the superjunctoin structure. As can be understood from FIG. 10, the drain—source capacitance Cds at a low drain voltage is higher in the power MOSFET having the superjunctoin structure shown in FIGS. 1–7 than in the power MOSFET not having the superjunctoin structure. This means that since the change in voltage dV/dt can be curbed when the drain voltage is in a lower range, it is possible to decrease the parallel-connected capacitance Co. Furthermore, since the SBD 20, which is connected in parallel with the power MOSFET, also has the superjunctoin structure, as shown in FIG. 1, it is possible to decrease the capacitance Co further. When it is possible to decrease the gate capacitance and to increase the switching frequency sufficiently, it is possible to eliminate the parallel-connected capacitance Co, and to operate the converter with a curbed dV/dt by using only the capacitance of the MOSFET and the SBD.

Fifth Embodiment

Figure 11:
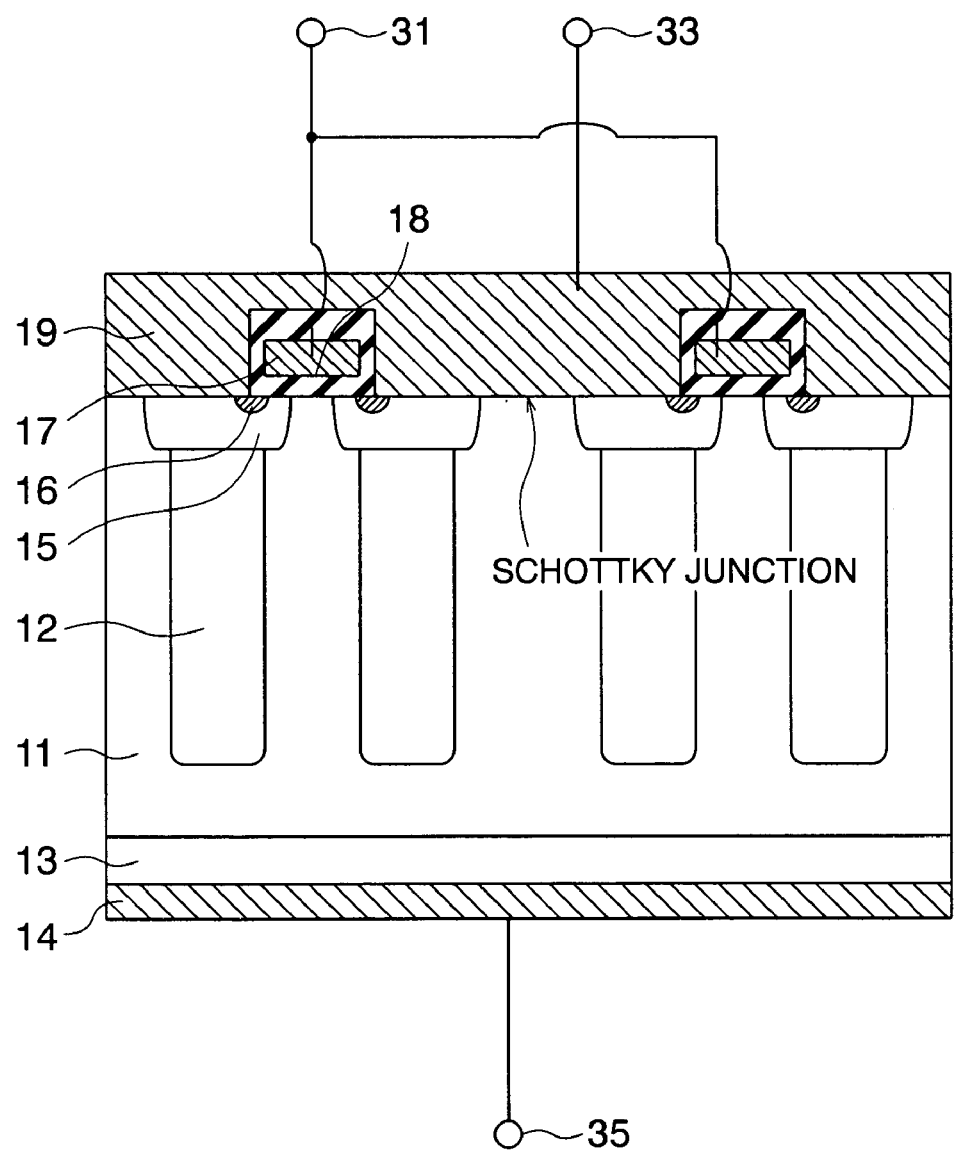
FIG. 11 is a sectional view showing the structure of a power semiconductor device according to a fifth embodiment of the present invention.

A power semiconductor device according to a fifth embodiment of the present invention will be described below with reference to FIG. 11, which is a sectional view showing the structure thereof. The power semiconductor device of this embodiment includes a power MOSFET having an SBD therein. Unlike the first to third embodiments, in the power semiconductor device of this embodiment, only one n type source layer 16 is formed on each of the p type base layers 15 at a side facing an adjacent p type base layer 15. The two n type source layers 16 formed at the internal sides of the two adjacent p type base layers 15 have a common gate electrode 19 formed to contact the adjacent two p type base layers 15 with a gate dielectric film inserted therebetween. The other sides of the p type base layers 15 serve as regions operating an SBD. In this embodiment, a source electrode 17 is formed on a region except for the regions in which the gate electrodes 19 are formed, and connected with the n-type drift layer 11 by the Schottky junction.

The power semiconductor device of this embodiment has a structure in which a power MOSFET and an SBD are formed on one chip. Accordingly, a process to connect the power MOSFET with the SBD can be eliminated. Since there is still an internal pn diode, it is preferable that the lifetime be shortened by the diffusion of platinum, etc.

Moreover, it is possible to decrease the ON resistance by providing a stripe-pattern structure in which the superjunctoin structure and the MOS gate structure intersect with each other. However, when the superjunctoin structure and the MOS gate structure are formed to intersect with each other with the structure shown in FIG. 11 being retained, the region operating as the MOSFET and the region operating as the SBD are separated by the p⁻ type pillar layers 12. This means that the device has the same structure as shown in FIG. 2, in which the MOSFET and the SBD are separately formed on the common substrate.

Figure 12:
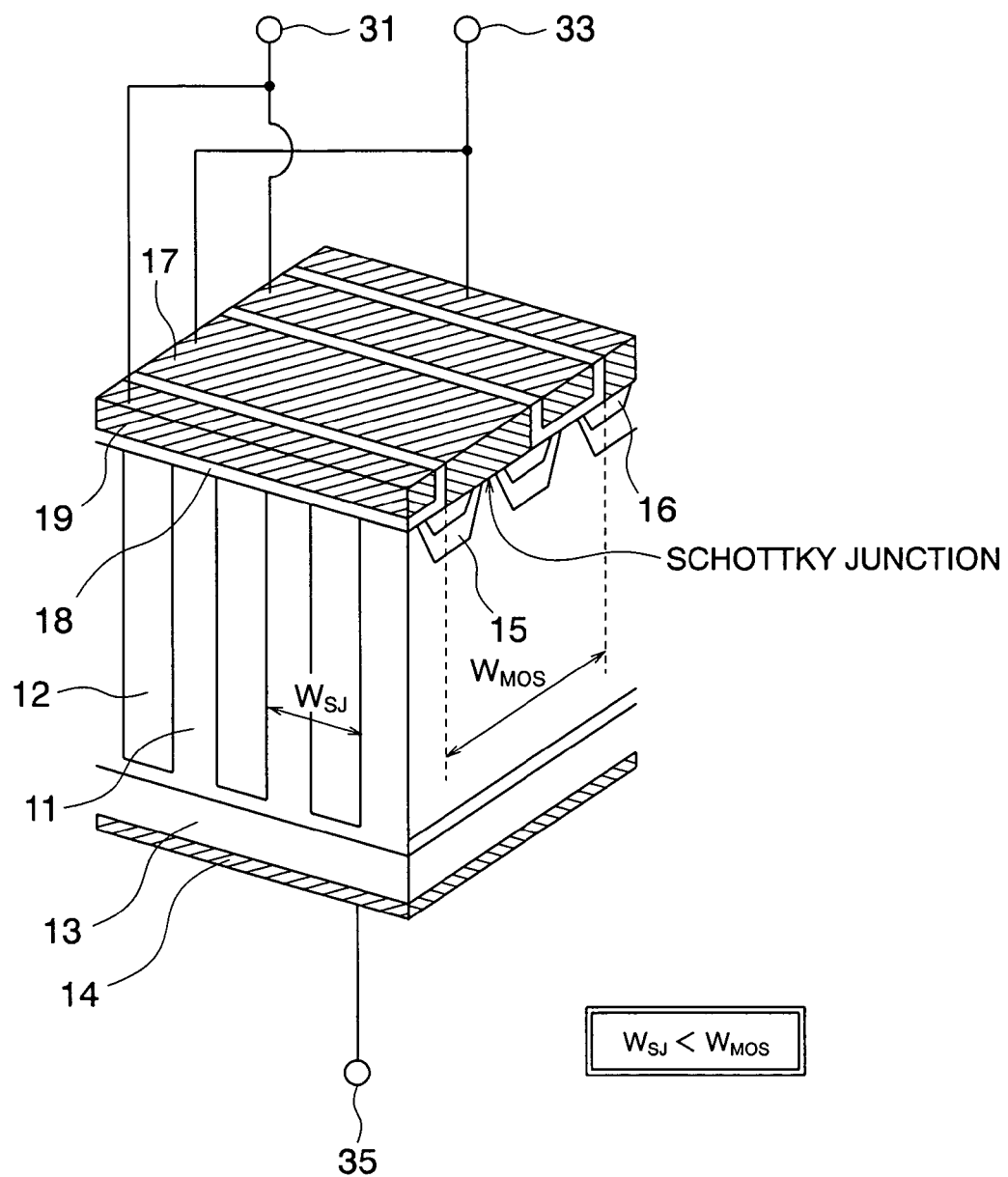
FIG. 12 is a perspective view showing the structure of a power MOSFET according to a first modification of the fifth embodiment.
Figure 13:
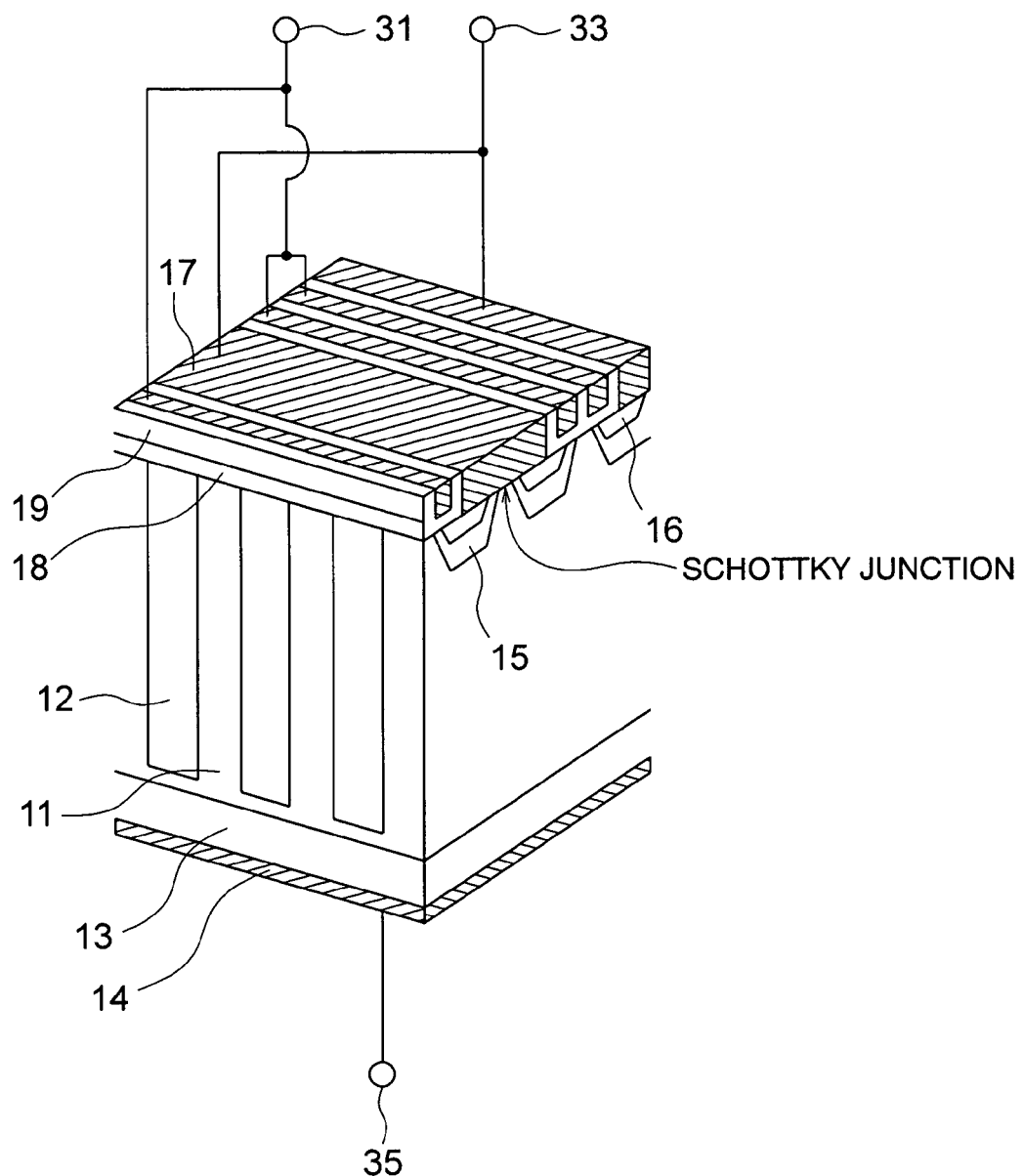
FIG. 13 is a perspective view showing the structure of a power MOSFET according to a second modification of the fifth embodiment.

When the structure shown in FIG. 12 is employed, since there is no boundary between the MOSFET region and the SBD region, the chip area virtually increases, thereby decreasing the ON resistance. In other words, it is possible to decrease the chip area in order to have the same ON resistance. Moreover, it is possible to decrease the gate capacitance by making the horizontal direction intervals $W_{MOS}$ of the MOS gate wider than the horizontal direction intervals $W_{SJ}$ of the superjunctoin structure, thereby achieving the higher speed and decreasing the load of the gate drive circuit. In addition, it is possible to decrease the gate capacitance further by modifying the gate electrode 19 to have the split gate structure as shown in FIG. 13.

Figure 14:
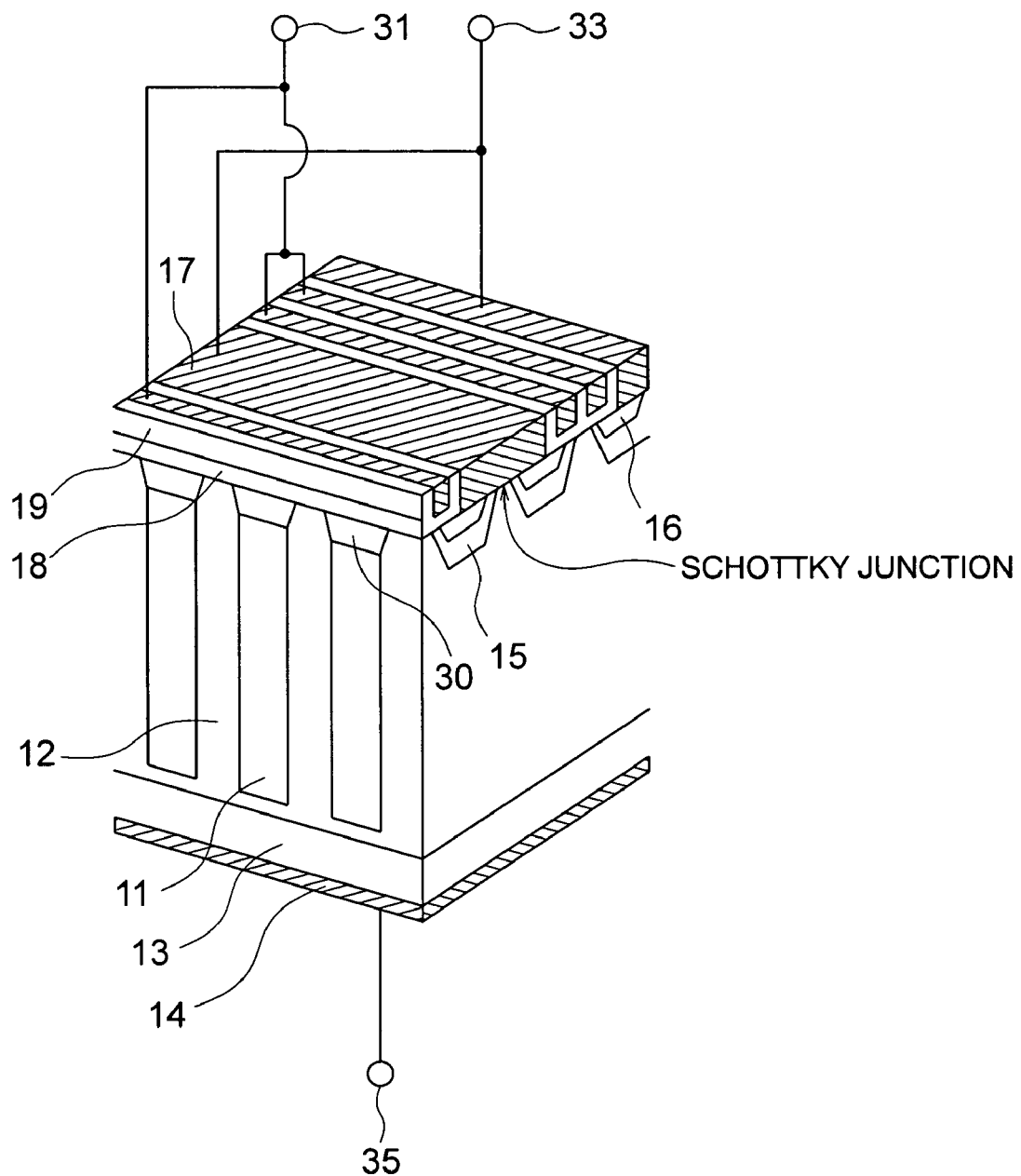
FIG. 14 is a perspective view showing the structure of a power MOSFET according to a third modification of the fifth embodiment.

When the gate electrode 19 is modified to have the split gate structure, it is possible that the electric field at the end portions of the p type base layers 15 increases, thereby decreasing the withstand voltage. However, this can be solved by forming a p type gate layer 30 only on the surface of each of the p⁻ type pillar layers 12, as shown in FIG. 14, thereby relaxing the electric field and curbing the decrease in withstand voltage.

The power MOSFET including the SBD as shown in FIGS. 11 to 14 can be applied to the MOSFET and the diode portion of the flyback converter shown in FIG. 8. Thus, the power MOSFET can be effectively used in a soft switching circuit in which a capacitance is connected in parallel with a switching element.

Sixth Embodiment

Figure 15:
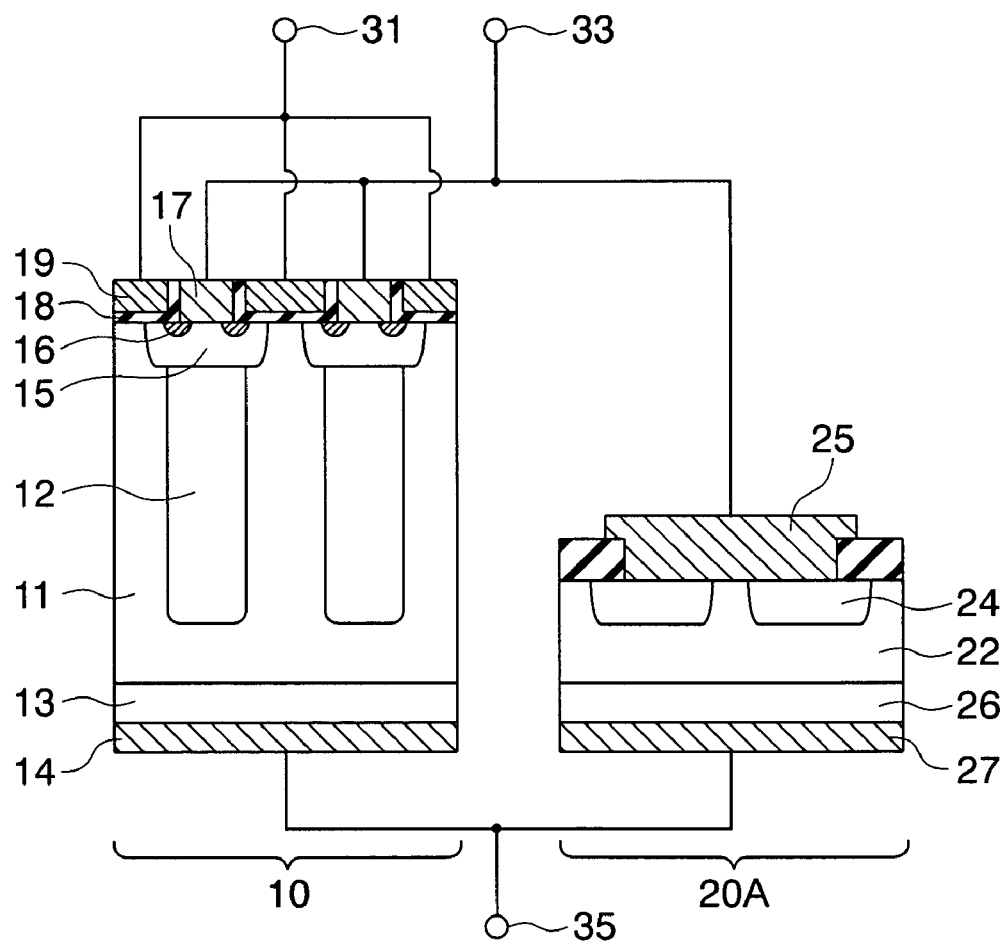
FIG. 15 is a sectional view showing the structure of a power semiconductor device according to a sixth embodiment of the present invention.

Next, a sectional view of the structure of a power semiconductor device according to a sixth embodiment of the present invention is shown in FIG. 15. The power semiconductor device of this embodiment includes a power MOSFET 10 having the superjunctoin structure of the first embodiment, and an SBD 20A connected in parallel with this power MOSFET. The SBD 20A is obtained by removing the p⁻ type pillar layers 23, and forming the n⁺ type drift layer 22, the guard ring layer 24, and the n+ type cathode layer 26 of a wide band gap semiconductor in the SBD 20 of the first embodiment.

Generally, a limit of the withstand voltage of an SBD using silicon is about 200 V since the ON resistance thereof is high. Accordingly, the first to third embodiments employ the superjunctoin structure to have a lower ON resistance, thereby increasing the breakdown voltage to about 600 V.

In this embodiment, however, the p⁻ type pillar layers are removed, and a wide band gap semiconductor such as SiC and GaN is employed as a material of the n⁻ type drift layer 22, the guard ring layer 24, and the n⁺ type cathode layer 26, thereby achieving the SBD 20A having a low ON resistance and a high withstand voltage without using the superjunctoin structure. A high-speed recovery at the time of the turning-on of the soft switching operation can be expected by connecting the SBD 20A in parallel with the MOSFET 10 having the superjunctoin structure, thereby enabling a decrease in power loss.

Figure 16:
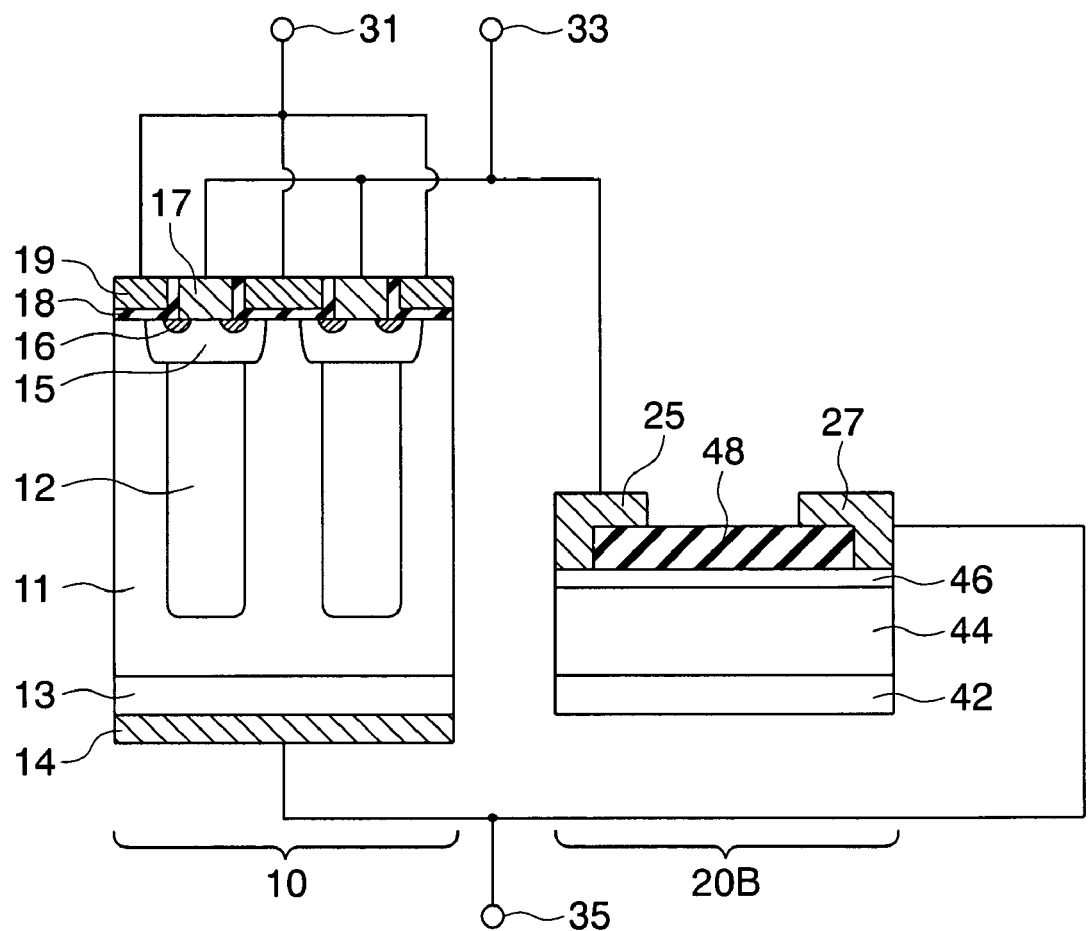
FIG. 16 is a perspective view showing the structure of a power MOSFET according to a first modification of the sixth embodiment.

It is also possible to have a low ON resistance and a high withstand voltage by using, instead of the SBD 20A formed of a wide band gap semiconductor, a horizontal SBD 20B having an AlGaN/GaN hetero junction structure including an intrinsic GaN layer 44 formed on a substrate 42, an n⁻ type AlGaN layer 46 formed on the GaN layer 44, and an anode electrode 25 and a cathode electrode 27 formed on the n⁻ type AlGaN layer 46 as shown in FIG. 16. The horizontal SBD 20B achieves a higher withstand voltage by having a field plate structure by forming the anode electrode 25 and the cathode electrode 27 on the n⁻ type AlGaN layer 46 with an insulating layer 48 inserted therebetween. The anode electrode 25 may be formed of Au/Ni, etc., to constitute the Schottky junction with the n⁻ type AlGaN layer 46, and the cathode electrode 27 may be formed of Ti/Al, etc., to constitute an ohmic electrode with the n⁻ type AlGaN layer 46.

Also in this case, there is an internal pn diode in the MOSFET. Accordingly, it is preferable that the lifetime be shortened by diffusing platinum, etc., thereby increasing the ON voltage, and increasing the speed of the recovery.

Figure 17:
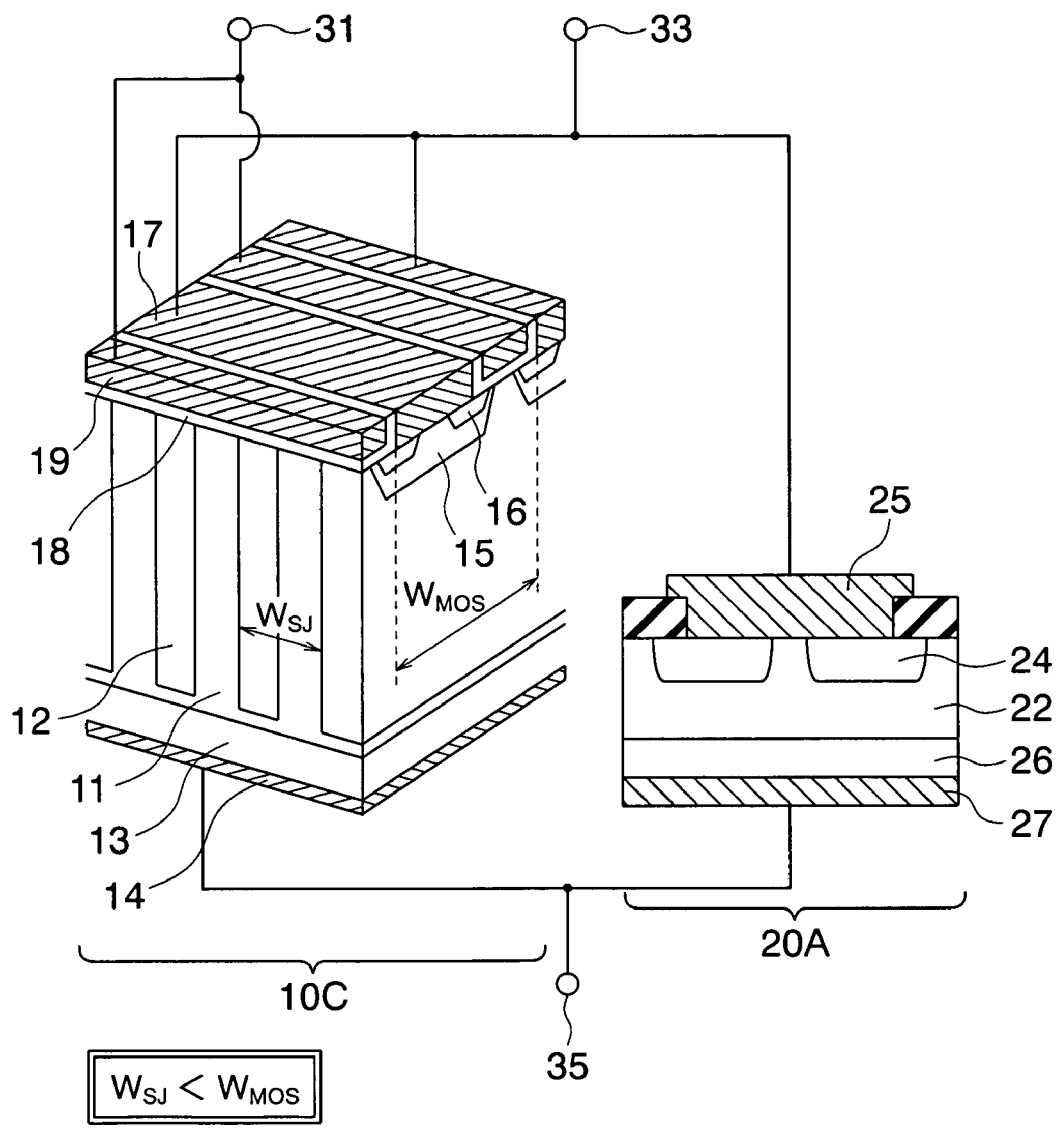
FIG. 17 shows the structure of a power MOSFET according to a second modification of the sixth embodiment.
Figure 18:
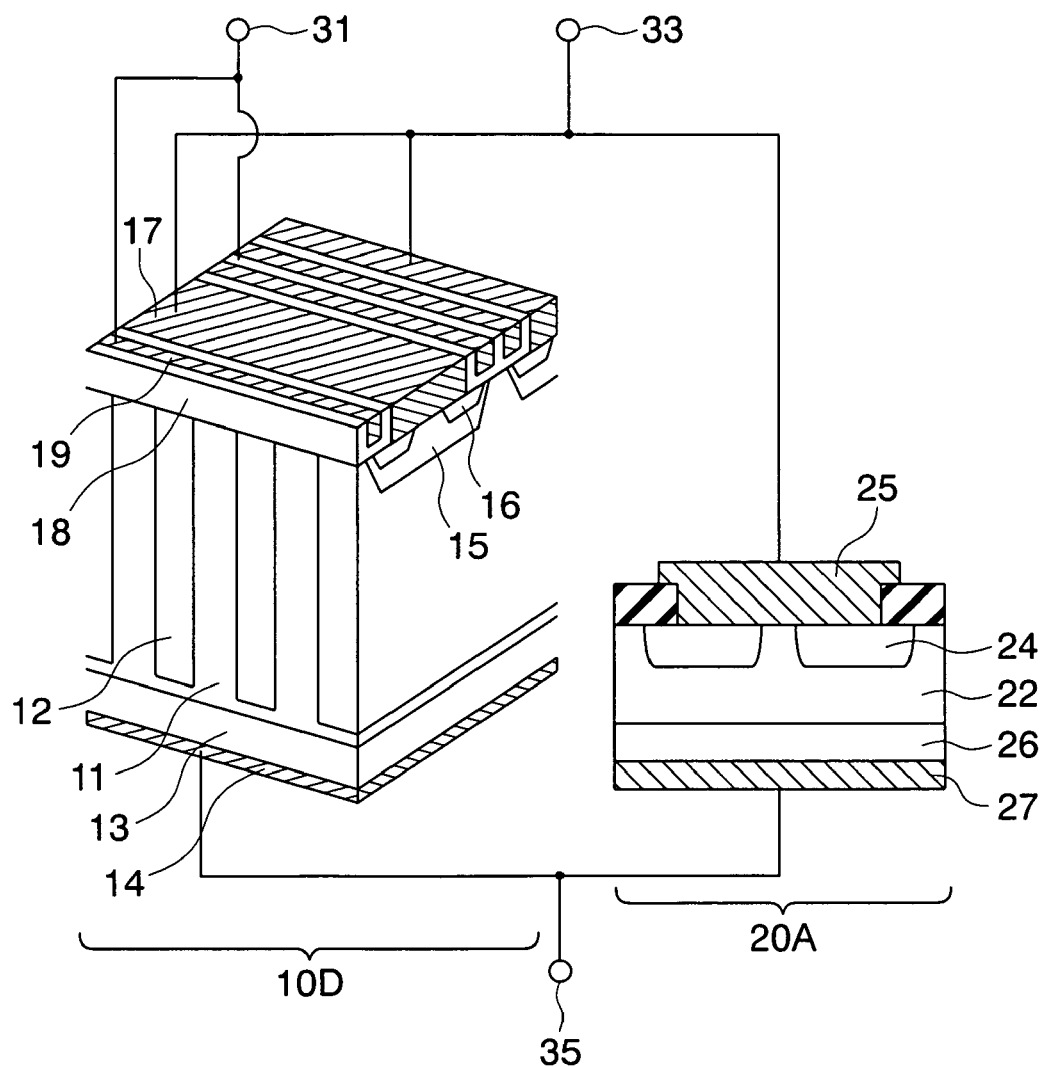
FIG. 18 shows the structure of a power MOSFET according to a third modification of the sixth embodiment.
Figure 19:
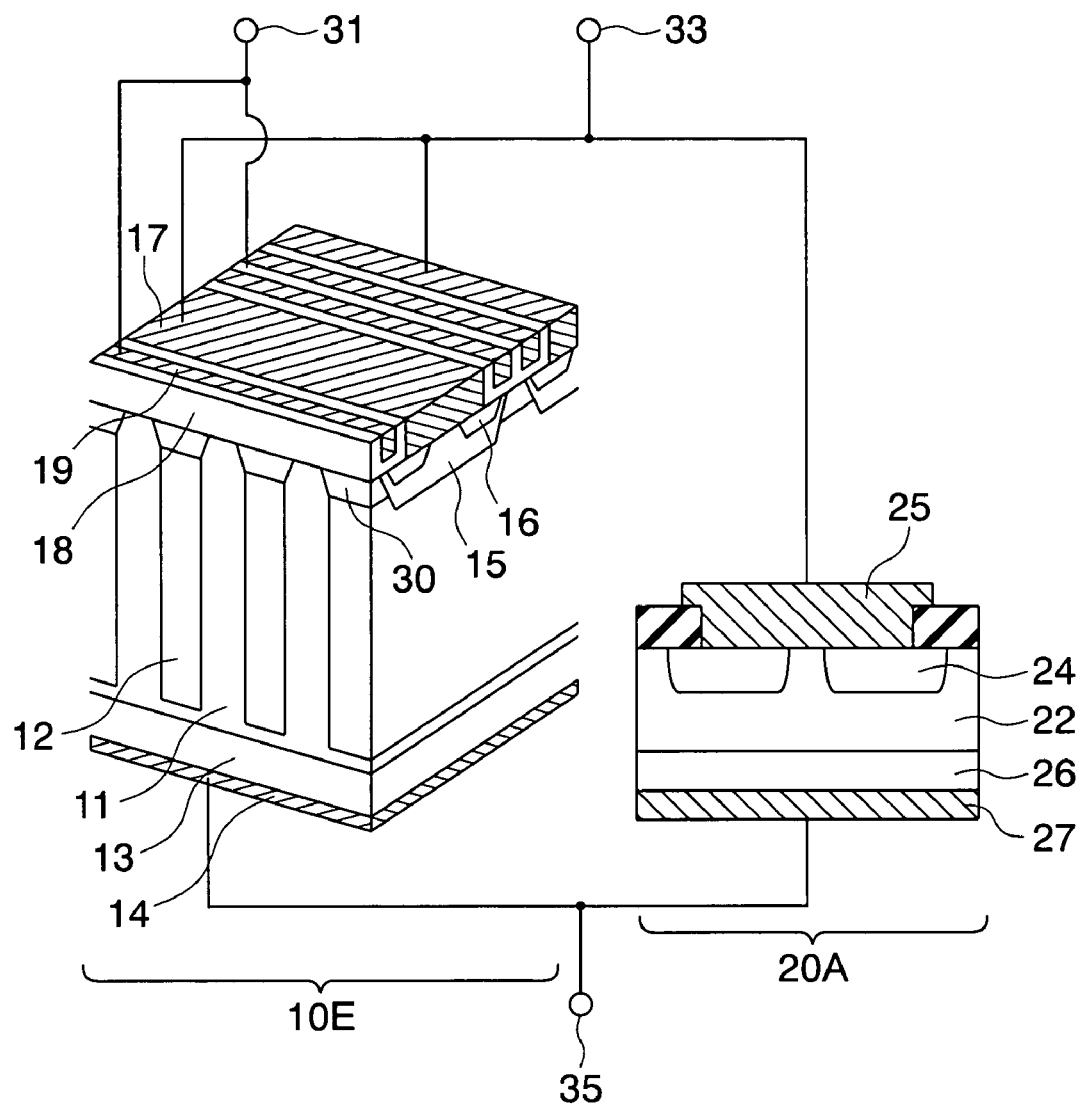
FIG. 19 shows the structure of a power MOSFET according to a fourth modification of the sixth embodiment.

Furthermore, in this embodiment, it is possible to decrease the gate capacitance, increasing the speed, and decreasing the load of the gate drive circuit by replacing the power MOSFET 10 with the power MOSFET 10C, in which the horizontal intervals of the MOS gate structure are made wider (see FIG. 17), or with the power MOSFET 10D or 10E having the split gate structure (see FIGS. 18 and 19), of the third embodiment and the modifications thereof. Furthermore, it is possible to apply this embodiment to a soft switching circuit as shown in FIG. 8. With respect to FIGS. 17 to 19, it is possible to have the same effects by replacing the SBD 20A formed of a wide band gap semiconductor with the horizontal SBD 20B having the AlGaN/GaN hetero structure.

Seventh Embodiment

Figure 20:
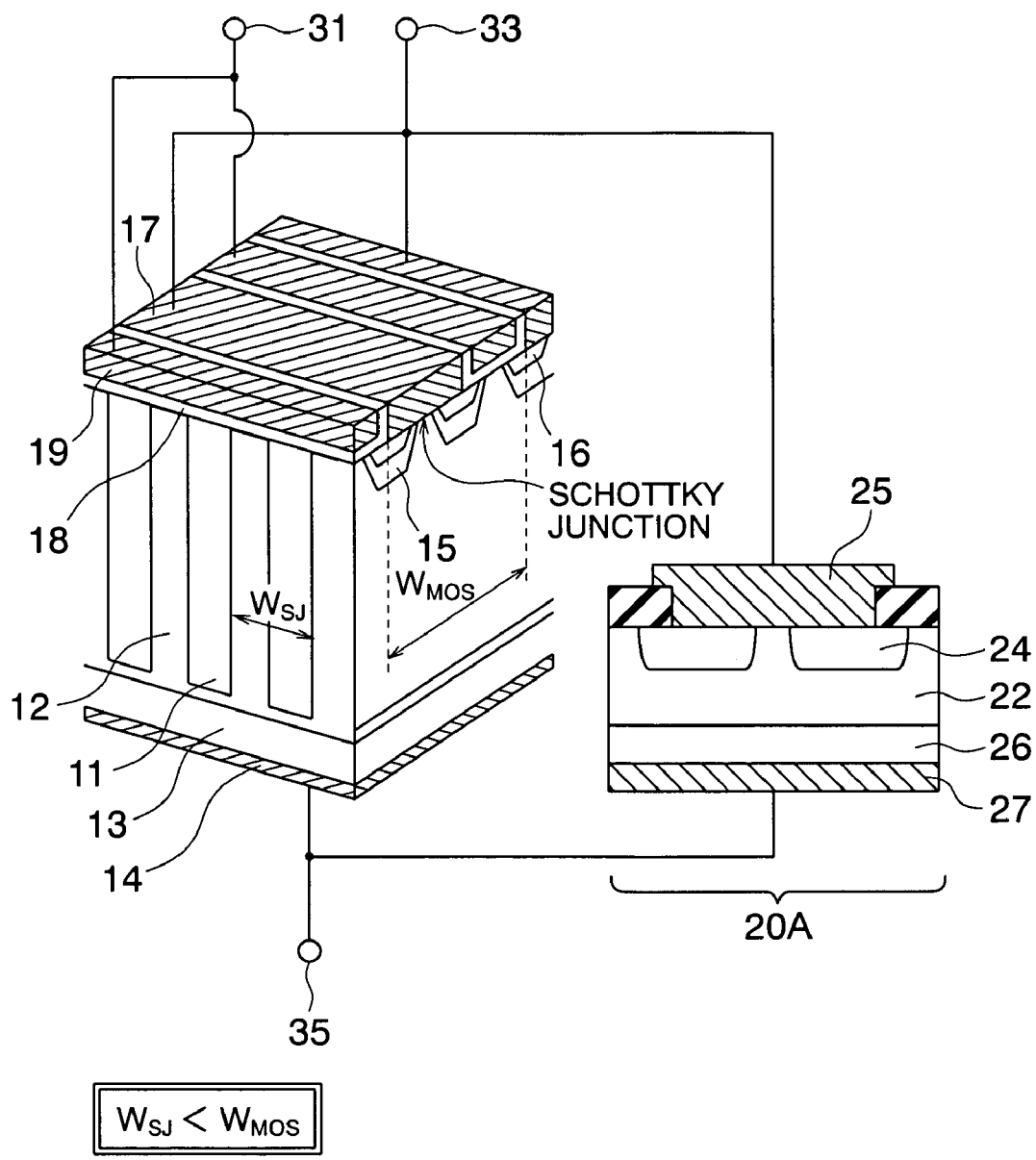
FIG. 20 shows the structure of a power semiconductor device according to a seventh embodiment of the present invention.

Next, the structure of a power semiconductor device according to a seventh embodiment of the present invention is shown in FIG. 20.

In this embodiment, a power MOSFET having the superjunctoin structure including an SBD is connected in parallel with an SBD 20A formed of a wide band gap semiconductor. With such a structure, when a great voltage is applied due to, e.g., a delay in the timing of a gate control signal, substantially no current flows through the internal pn diode because a large part of the current flows through the internal SBD and the wide band gap semiconductor SBD. Accordingly, it is possible to maintain a high-speed recovery. In order to reliably cause a current to flow through the SBD 20A formed of a wide band gap semiconductor, it is preferable that the carrier lifetime of the n⁻ type drift layer 11 of the MOSFET having the superjunctoin structure be as short as possible.

As described above, according to the embodiments of the present invention, it is possible to have a power semiconductor device including a power MOSFET suitable for a soft switching system. With this device, it is possible to improve the efficiency and decrease the size of the power supply circuit.

Since the embodiments of the present invention relate to the structures of MOSFETs and SBDs for achieving a lower power loss in a soft switching circuit, it is possible to form them without being dependent on the method of forming the superjunctoin structure. For example, it is possible to employ a multi epitaxial method in which an ion implantation and an embedded exitaxial growth are repeated, and a method in which trench grooves are filled by using crystal growth.

Furthermore, although methods for shortening the carrier lifetime have been described, the effects of the embodiments of the present invention relate to the decrease in recovery time achieved by the decrease in carrier lifetime to increase the ON voltage of the internal pn diode. Therefore, the embodiments are not limited by the method employed to achieve the aforementioned effects. Although the methods of using platinum diffusion, electron beam irradiation, proton irradiation, etc. have been described, not only these methods but also other methods or multiple combinations of such methods can also be employed.

Although the present invention has been described with reference to the first to seventh embodiments, the present invention is not limited to these embodiments but all other modifications easily made by those skilled in the art would be in the scope of the present invention. For example, the MOSFET can be of a p-channel type instead of an n-channel type. Furthermore, although a MOSFET having a vertical superjunctoin structure has been described in each embodiment, an MOSFET having a horizontal superjunctoin can also be employed.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concepts as defined by the appended claims and their equivalents.

What is claimed is:

1. A power semiconductor device comprising:
  a power switching element including:
    a first semiconductor layer of a first conductivity type;
    a plurality of second semiconductor layers of a second conductivity type, which are in a columnar shape, and arranged in the first semiconductor layer at certain intervals in a direction parallel to a layer surface of the first semiconductor layer;
    a first electrode formed on a surface of one side of the first semiconductor layer, the first electrode being electrically connected with the first semiconductor layer;
    a plurality of third semiconductor layers selectively formed in a surface region of the other side of the first semiconductor layer, the third semiconductor layers being connected to the second semiconductor layers;
    a fourth semiconductor layer of the first conductivity type selectively formed in a surface region of the third semiconductor layers;
    second electrodes formed so as to contact surfaces of the third semiconductor layers and the fourth semiconductor layer; and
    gate electrodes formed on regions of the first semiconductor layer sandwiched between the adjacent third semiconductor layers, gate dielectric films being inserted between the gate electrodes and the first semiconductor layer; and
  a Schottky barrier diode in which a cathode is connected to the first electrode of the power switching element, and an anode is connected to the second electrodes of the power switching element.

2. The power semiconductor device according to claim 1, wherein a carrier lifetime of the first semiconductor layer and the second semiconductor layers is 1 $\mu$s or less.

3. The power semiconductor device according to claim 2, wherein the Schottky barrier diode includes:
  a fifth semiconductor layer of the first conductivity type, one side of which is electrically connected with the cathode electrode;
  a plurality of sixth semiconductor layers of the second conductivity type, which are in a columnar shape and arranged at certain intervals in the fifth semiconductor layer in a direction parallel to a layer surface of the fifth semiconductor layer; and
  seventh semiconductor layers of the second conductivity type selectively formed in a surface region of the other side of the fifth semiconductor layer, the seventh semiconductor layers contacting the sixth semiconductor layers,
and wherein the anode electrode contacts surfaces of the fifth semiconductor layer and the seventh semiconductor layers.

4. The power semiconductor device according to claim 2, wherein the Schottky barrier diode is formed of a semiconductor having a band gap of 3 eV or more.

5. The power semiconductor device according to claim 4, wherein the Schottky barrier diode is formed of SiC.

6. The power semiconductor device according to claim 4, wherein the Schottky barrier diode has a hetero junction structure formed of AlGaN/GaN.

7. The power semiconductor device according to claim 1, wherein the Schottky barrier diode and the power switching element are formed on the same substrate.

8. The power semiconductor device according to claim 7, wherein the Schottky barrier diode is formed within the power switching element.

9. The power semiconductor device according to claim 8, wherein:
  the first semiconductor layer and the second semiconductor layers of the power switching element are formed to have a stripe pattern; and
  the gate electrodes are formed to have a stripe pattern in a direction perpendicular to the first semiconductor layer.

10. The power semiconductor device according to claim 9, wherein intervals of the gate electrodes of the power switching element in the direction parallel to the surface thereof are wider than intervals of the second semiconductor layers in the direction parallel to the surface thereof.

11. The power semiconductor device according to claim 10, wherein the gate electrodes of the power switching element have a split gate structure.

12. The power semiconductor device according to claim 11, wherein eighth semiconductor layers of the second conductivity type are selectively formed on surfaces of the second semiconductor layers located under the gate electrodes of the power switching element.

13. The power semiconductor device according to claim 1, wherein the gate electrodes of the power switching element have a split gate structure.

14. The power semiconductor device according to claim 1, wherein the gate electrodes of the power switching element have a terrace gate structure.

15. The power semiconductor device according to claim 1, wherein the first semiconductor layer and the second semiconductor layers of the power switching element are formed to have a stripe pattern, and the gate electrodes are formed to have a stripe pattern in a direction perpendicular to the first semiconductor layer.

16. The power semiconductor device according to claim 15, wherein intervals of the gate electrodes of the power switching element in a direction along the surface thereof are wider than intervals of the second semiconductor layer in a direction along the surface thereof.

17. The power semiconductor device according to claim 16, wherein the gate electrodes of the power switching element have a split gate structure.

18. The power semiconductor device according to claim 17, wherein eighth semiconductor layers of the second conductivity type are selectively formed on surfaces of the second semiconductor layers located under the gate electrodes of the power switching element.

19. A power supply circuit comprising:
 a power semiconductor device of claim 3; and
 a capacitor connected in parallel with the power semiconductor device between the first electrode and the second electrode of the power switching element.

20. A power supply circuit comprising:
 a power semiconductor device of claim 11; and
 a capacitor connected in parallel with the power semiconductor device between the first electrode and the second electrode of the power switching element.

* * * * *